(12) United States Patent
Kuo

(10) Patent No.: US 11,764,742 B2
(45) Date of Patent: Sep. 19, 2023

(54) SWITCHING AMPLIFIER WITH ADAPTIVE SUPPLY-VOLTAGE SCALING

(71) Applicant: National Cheng Kung University, Tainan (TW)

(72) Inventor: Tai-Haur Kuo, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 17/673,822

(22) Filed: Feb. 17, 2022

(65) Prior Publication Data

US 2023/0261620 A1 Aug. 17, 2023

(51) Int. Cl.
*H03F 1/02* (2006.01)
*H03F 3/217* (2006.01)

(52) U.S. Cl.
CPC ......... *H03F 3/2173* (2013.01); *H03F 1/0227* (2013.01); *H03F 2200/03* (2013.01); *H03F 2200/351* (2013.01); *H03F 2200/462* (2013.01); *H03F 2200/471* (2013.01)

(58) Field of Classification Search
CPC .. H03F 3/2173; H03F 1/0227; H03F 2200/03; H03F 2200/351; H03F 2200/462; H03F 2200/471
USPC ........................ 330/10, 251, 207 A, 136, 297
See application file for complete search history.

(56) References Cited

U.S. PATENT DOCUMENTS 10,763,811 B2 * 9/2020 Zhu .......................... H03F 3/187

OTHER PUBLICATIONS

Yi-Zhi Qiu, Shih-Hsiung Chien, and Tai-Haur Kuo, "A 0.4-mA-Quiescent-Current, 0.00091%-THD+N Class-D Audio Amplifier with Low-Complexity Frequency Equalization for PWM-Residual-Aliasing Reduction," IEEE J. Solid-State Circuits, vol. 57, No. 2, pp. 423-433, Feb. 2022.

Jia-Ming Liu, Shih-Hsiung Chien, and Tai-Haur Kuo, "A 100 W 5.1-Channel Digital Class-D Audio Amplifier with Single-Chip Design," IEEE J. Solid-State Circuits, vol. 47, No. 6, pp. 1344-1354, Jun. 2012.

* cited by examiner

*Primary Examiner* — Hieu P Nguyen
(74) *Attorney, Agent, or Firm* — Winston Hsu

(57) ABSTRACT

A switching amplifier comprises a controller, configured to receive an input signal and a reference signal, and to generate a control signal according to the input signal and the reference signal; a pulse-width modulation (PWM) modulator, coupled to the controller, configured to generate a PWM signal according to the input signal and the control signal; a power management unit, coupled to the controller, configured to receive a power supply and the control signal, and to provide an adaptive supply voltage according to the power supply and the control signal; and a switching power stage, coupled to the power management unit and the PWM modulator, configured to generate an output signal according to the PWM signal and the adaptive supply voltage.

14 Claims, 6 Drawing Sheets

SWITCHING AMPLIFIER WITH ADAPTIVE SUPPLY-VOLTAGE SCALING

BACKGROUND OF THE INVENTION

1. Field of the Invention

The present invention relates to a switching amplifier, and more particularly, to a switching amplifier with adaptive supply-voltage scaling to relax the timing non-idealities on the output signal.

2. Description of the Prior Art

Switching amplifiers provide characteristics of power saving and high efficiency of output signals. However, the output pulse-width modulation (PWM) signals are affected by timing non-idealities, which are induced by the PWM modulator and the switching power stage. The timing non-idealities include clock jitter, dead time and rise/fall time mismatch, which may reduce a signal-to-noise ratio (SNR), a dynamic range (DR) and linearity of the output signals. Thus, how to reduce the timing non-idealities of the switching amplifier is a problem to be solved.

SUMMARY OF THE INVENTION

The present invention therefore provides a switching amplifier to solve the abovementioned problem.

A switching amplifier comprises a controller, configured to receive an input signal and a reference signal, and to generate a control signal according to the input signal and the reference signal; a pulse-width modulation (PWM) modulator, coupled to the controller, configured to generate a PWM signal according to the input signal and the control signal; a power management unit, coupled to the controller, configured to receive a power supply and the control signal, and to provide an adaptive supply voltage according to the power supply and the control signal; and a switching power stage, coupled to the power management unit and the PWM modulator, configured to generate an output signal according to the PWM signal and the adaptive supply voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
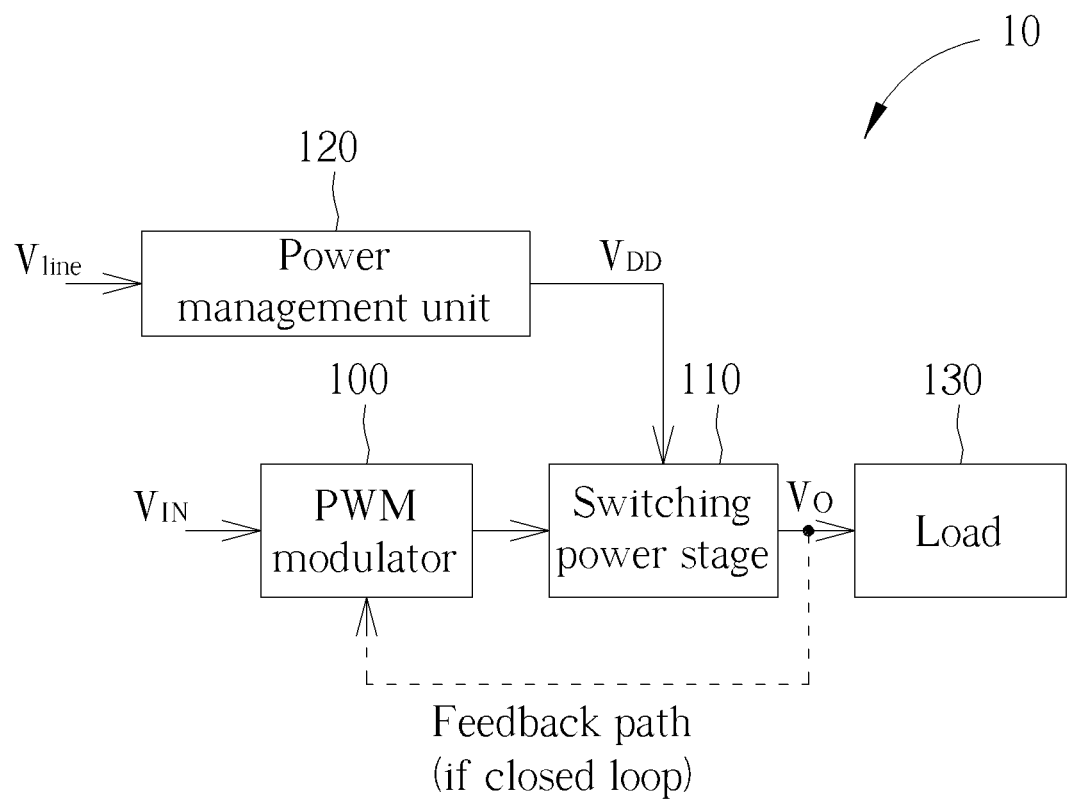
FIG. 1 is a schematic diagram of a switching amplifier according to the prior art.

FIG. 1 is a schematic diagram of a switching amplifier 10 according to the prior art. The switching amplifier 10 includes a pulse-width modulation (PWM) modulator 100, a switching power stage 110, a power management unit 120 and a load 130. The PWM modulator 100 generates a PWM signal according to the input signal $V_{IN}$. The power management unit 120 provides a constant supply voltage $V_{DD}$ to supply the switching power stage 110 according to a power supply $V_{line}$. The power management unit 120 may not be necessary in some applications.

The switching power stage 110 may be supplied by the power supply $V_{line}$ (i.e., the supply voltage $V_{DD}$) instead of being supplied by the power management unit 120. The switching power stage 110 generates an output signal $V_O$ according to the PWM signal and the supply voltage $V_{DD}$, and drives the load 130. The switching power stage 110 comprises a plurality of power switches. The switching power stage 110 may be a half-bridge topology or a full-bridge topology according to the arrangement of the plurality of power switches. The switching amplifier 10 may be an open-loop configuration, or may be a closed-loop configuration if the output signal $V_O$ is fed back to the PWM modulator 100.

Figure 2:
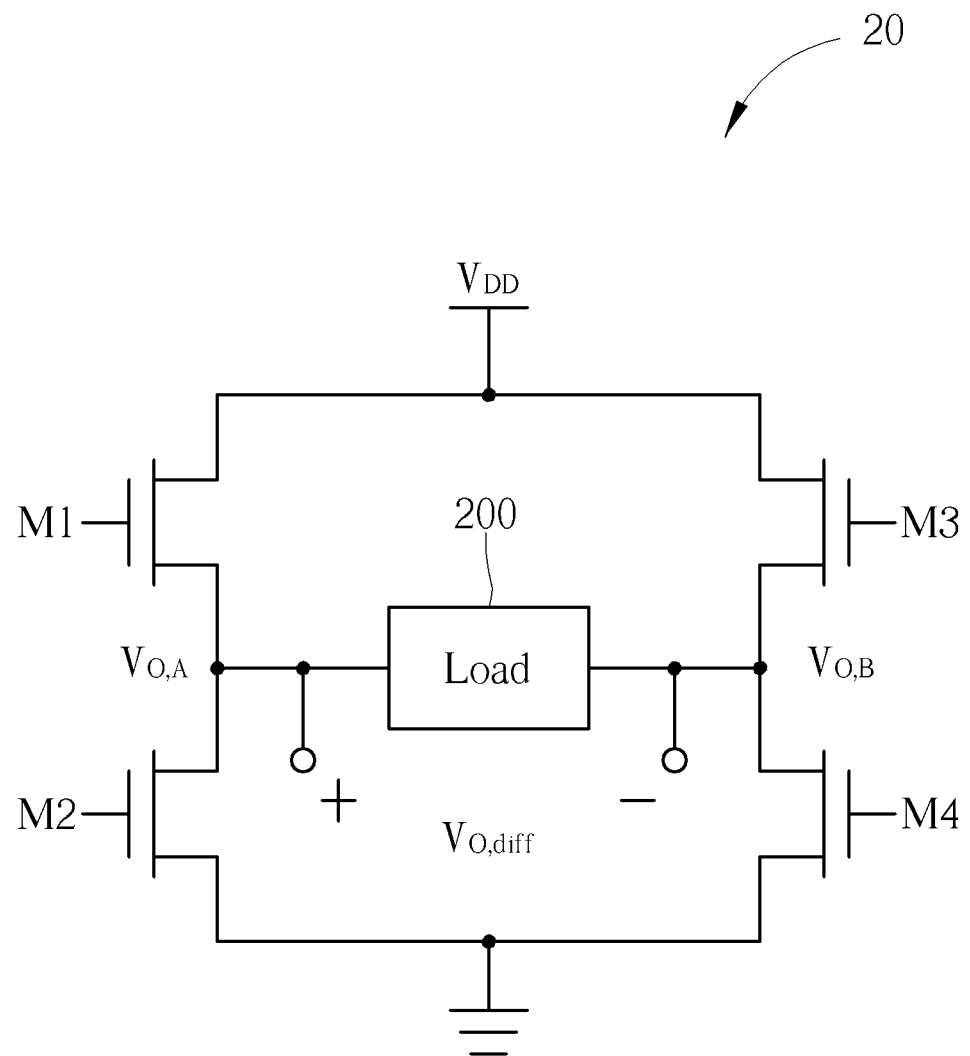
FIG. 2 is a schematic diagram of a full-bridge switching power stage of a switching amplifier.

FIG. 2 is a schematic diagram of a full bridge switching power stage 20 of a switching amplifier. The full-bridge power stage 20 includes power switches M1, M2, M3 and M4. A signal modulated by a PWM modulator (e.g., the PWM modulator 100) drives the power switches M1, M2, M3 and M4. The power switches M1 and M2 are coupled to an output node $V_{O,A}$, and the power switches M3 and M4 are coupled to an output node $V_{O,B}$. The output nodes $V_{O,A}$ and $V_{O,B}$ are coupled to a supply voltage $V_{DD}$, or are coupled to ground. A differential-mode signal $V_{O,diff}$ is derived according to voltage differences of the output nodes $V_{O,A}$ and $V_{O,B}$, and is coupled to a load 200 for outputting the signal.

Figure 3:
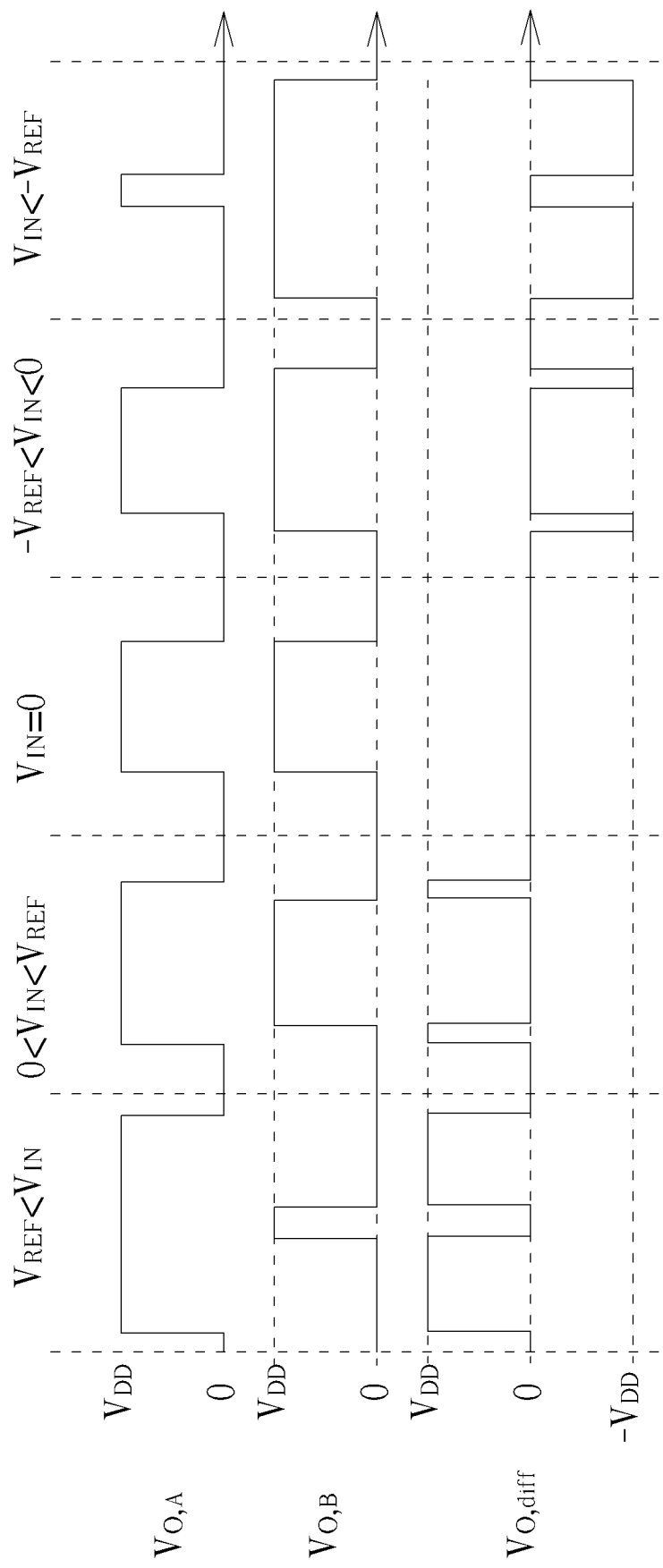
FIG. 3 shows waveforms of the single-ended signal of each output node and the differential-mode signal of the switching power stage in the switching amplifier according to the prior art.

FIG. 3 shows waveforms of the single-ended signal of each output node $V_{O,A}$ and $V_{O,B}$ and the differential-mode signal $V_{O,diff}$ of the switching power stage 110 in the switching amplifier 10 according to the prior art. The switching power stage 110 may be the full-bridge switching power stage 20, but is not limited thereto. As shown in FIG. 3, a plurality of pulse widths of the differential-mode signal $V_{O,diff}$ are changed according to the input signal $V_{IN}$ under the condition of the fixed supply voltage $V_{DD}$. Thus, the plurality of pulse widths of the differential-mode signal $V_{O,diff}$ become narrow when the input signal $V_{IN}$ is small (e.g., an absolute value of the input signal $V_{IN}$ is smaller than a reference signal $V_{REF}$) The timing non-idealities at the edges of the PWM signal occupy a large proportion to the differential-mode signal $V_{O,diff}$. As a result, the differential-mode signal $V_{O,diff}$ with narrow pulse widths may be easily affected by the timing non-idealities, which may reduce the SNR of the output signal and correspondingly degrades the dynamic range (DR) of the switching amplifier 10.

Figure 4:
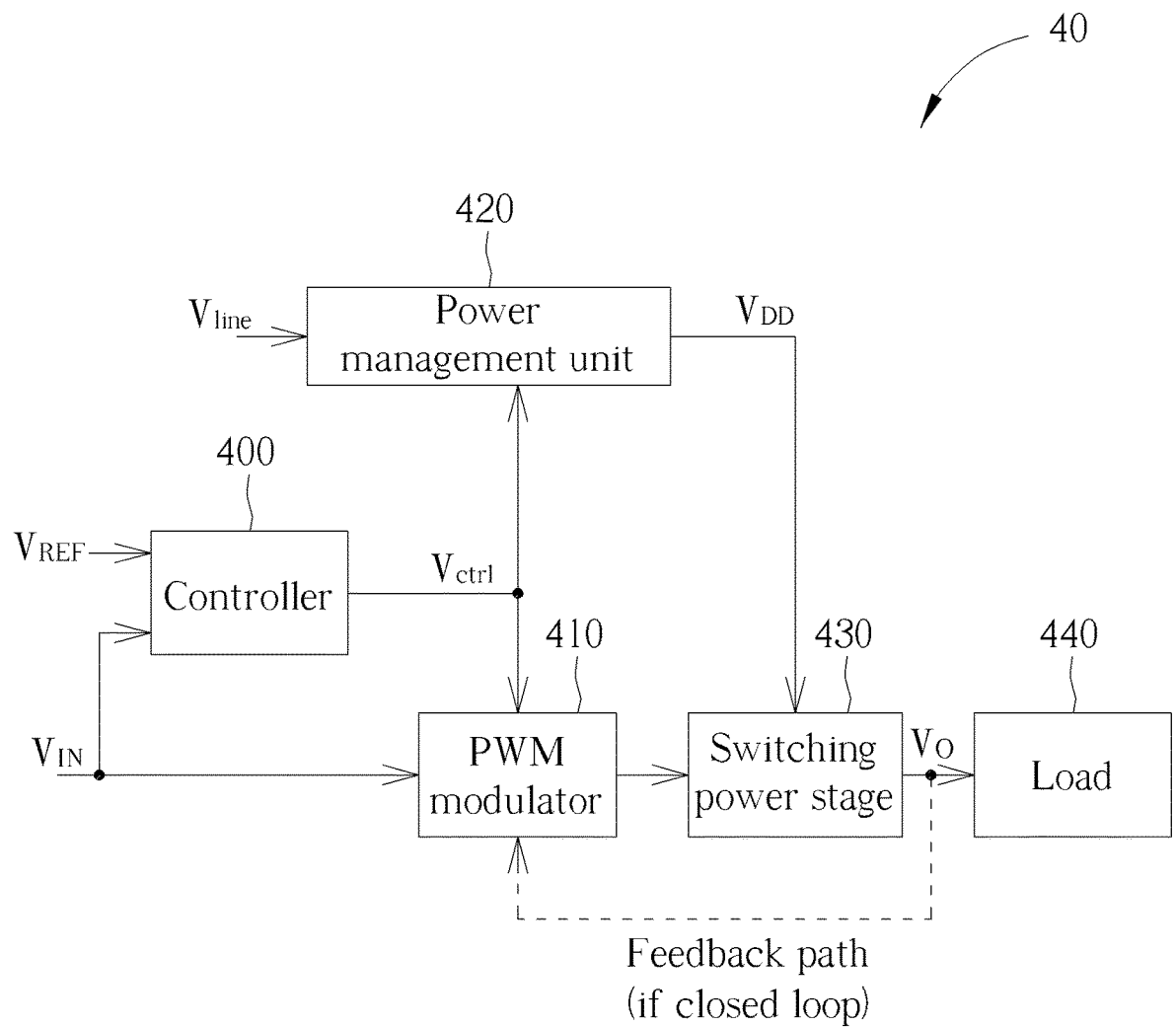
FIG. 4 is a schematic diagram of a switching amplifier according to an example of the present invention.

FIG. 4 is a schematic diagram of a switching amplifier 40 according to an example of the present invention. The switching amplifier 40 includes a controller 400, a PWM modulator 410, a power management unit 420, a switching power stage 430 and a load 440. The controller 400 is configured to receive an input signal $V_{IN}$ and a reference signal $V_{REF}$, and to generate a control signal $V_{ctrl}$ to the power management unit 420 and the PWM modulator 410. The PWM modulator 410 is coupled to the controller 400, and is configured to generate a PWM signal according to the input signal $V_{IN}$ and the control signal $V_{ctrl}$. The power management unit 420 is coupled to the controller 400, and is configured to provide an adaptive supply voltage $V_{DD}$ according to a power supply $V_{line}$ and the control signal $V_{ctrl}$. The switching power stage 430 is coupled to the power management unit 420 and the PWM modulator 410, and is configured to generate an output signal $V_O$ according to the PWM signal and the adaptive supply voltage $V_{DD}$. Then, the switching power stage 430 drives the output signal $V_O$ to the load 440. The switching power stage 430 includes a plurality of power switches. The switching power stage 430 may be a half-bridge topology or a full-bridge topology according to the arrangement of the power switches. The switching amplifier 40 may be an open-loop configuration, or may be a closed-loop configuration if the output signal $V_O$ is fed back to the PWM modulator 410. That is, compared with the switching amplifier 10 according to the prior art, the switching amplifier 40 includes the controller 400 to affect the PWM signal generated by the PWM modulator 410 and the adaptive supply voltage $V_{DD}$ provided by the power management unit 420. A plurality of pulse widths of the PWM signal and the adaptive supply voltage $V_{DD}$ may be adjusted according to the control signal $V_{ctrl}$ under a condition that the power difference between the output signal $V_O$ and the input signal $V_{IN}$ remains unchanged.

Figure 5:
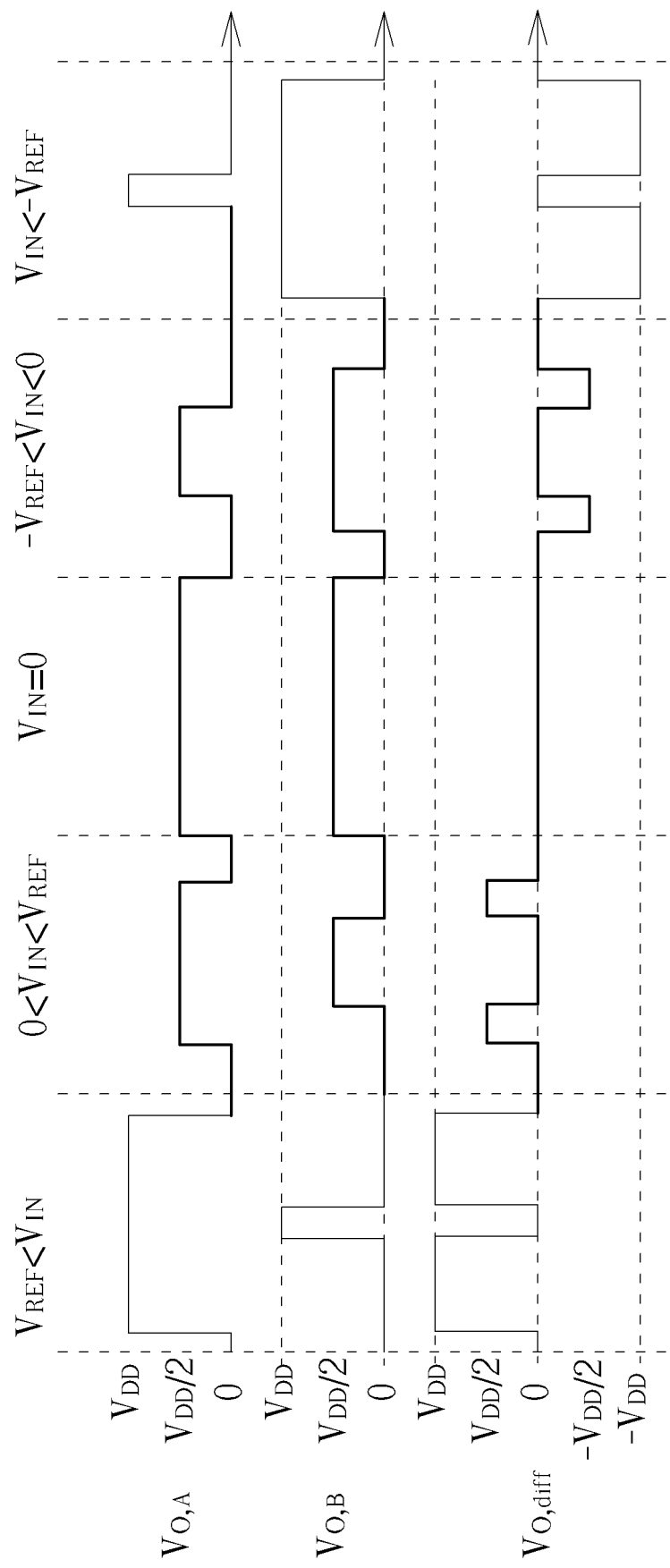
FIG. 5 shows waveforms of the single-ended signal of each output node and the differential-mode signal of the switching power stage in the switching amplifier according to an example of the present invention.

FIG. 5 shows waveforms of the single-ended signal of each output node $V_{O,A}$ and $V_{O,B}$ and the differential-mode signal $V_{O,diff}$ of the switching power stage 430 in the switching amplifier 40 according to an example of the present invention. The switching power stage 430 may be the full-bridge switching power stage 20, but is not limited thereto. As shown in FIG. 5, for the small input signal $V_{IN}$ (e.g., an absolute value of the input signal $V_{IN}$ is smaller than the reference signal $V_{REF}$) the plurality of pulse widths of the differential-mode signal $V_{O,diff}$ are doubled and the adaptive supply voltage $V_{DD}$ is halved (e.g., $V_{DD}/2$). That is, compared with the waveforms of the switching amplifier 10 according to the prior art (please refer to the waveforms in FIG. 3), when the input signal $V_{IN}$ is small, the plurality of pulse widths of the differential-mode signal $V_{O,diff}$ are wider so as to reduce the effect of timing non-idealities. The adaptive supply voltage $V_{DD}$ is lowered accordingly, which maintains the power of the differential-mode signal $V_{O,diff}$ the same as the power of the input signal $V_{IN}$. In addition, due to impedance change of the power switches with different adaptive supply voltage $V_{DD}$, an adjustment of the plurality of pulse widths of the PWM signal may be slightly affected.

Figure 6:
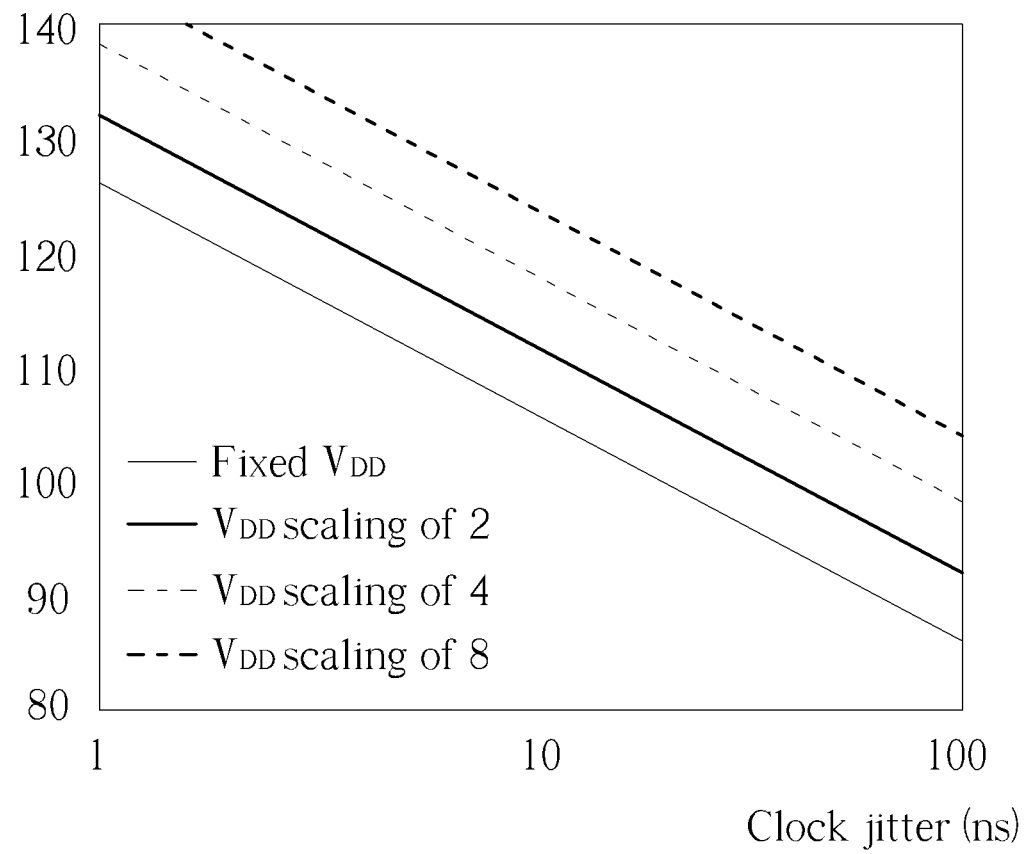
FIG. 6 shows the dynamic range versus the clock jitter plots with a switching amplifier according to the prior art and a switching amplifier according to an example of the present invention.

FIG. 6 shows the dynamic range versus the clock jitter plots with a switching amplifier 10 according to the prior art and a switching amplifier 40 according to an example of the present invention. As can be seen, the clock jitter effect is relaxed by two-times, four-times and eight-times when the adaptive supply voltage $V_{DD}$ of the switching amplifier 40 is scaled down to half, one-fourth and one-eighth of $V_{DD}$, respectively.

In one example, the controller 400 may detect a voltage or a current of the input signal $V_{IN}$.

In one example, the adaptive supply voltage $V_{DD}$ and a plurality of pulse widths of the PWM signal may be determined according to whether an absolute value of the input signal $V_{IN}$ is smaller than the reference signal $V_{REF}$.

In one example, the reference signal $V_{REF}$ includes (e.g., may be) at least one value, and the adaptive supply voltage $V_{DD}$ may be changed according to the input signal $V_{IN}$ and the at least one value of the reference signal $V_{REF}$. For example, the reference signal $V_{REF}$ may include 8 values. The adaptive supply voltage may be changed according to the 8 values of the reference signal $V_{REF}$.

In one example, the adaptive supply voltage $V_{DD}$ is halved and the plurality of pulse widths of the PWM signal are doubled, if the absolute value of the input signal $V_{IN}$ is smaller than the reference signal $V_{REF}$. In one example, the adaptive supply voltage $V_{DD}$ and the plurality of pulse widths of the PWM signal are not changed, if the absolute value of the input signal $V_{IN}$ is not smaller than the reference signal $V_{REF}$. That is, for small input signals (e.g., the absolute value of the input signal $V_{IN}$ is smaller than the reference signal $V_{REF}$) the plurality of pulse widths of the PWM signal are widened and the adaptive supply voltage $V_{DD}$ is lowered accordingly, which reduces the effect of timing non-idealities and maintains the power of the output signal unchanged. On the other hand, for large input signals (e.g., the absolute value of the input signal $V_{IN}$ is not smaller than the reference signal $V_{REF}$) the plurality of pulse widths of the PWM signal and the adaptive supply voltage maintains unchanged (i.e., the same as the supply voltage of the switching amplifier 10 according to the prior art).

In one example, an adjustment of the plurality of pulse widths of the PWM signal and an adjustment of the adaptive supply voltage $V_{DD}$ are complementary. For example, the adaptive supply voltage $V_{DD}$ may be reduced to $V_{DD}/3$, and the plurality of pulse widths of the PWM signal may be tripled, but is not limited thereto.

In one example, the input signal $V_{IN}$ includes a digital signal (e.g. a pulse-code modulation (PCM) signal represented by a plurality of bits) or an analog signal, but is not limited thereto.

In one example, the power supply includes (e.g., may be) a direct-current (DC) power supply. In one example, the power supply includes (e.g., may be) an alternating-current (AC) power supply.

In one example, the power management unit 420 includes a DC-DC buck converter, a DC-DC boost converter, a DC-DC buck-boost converter, or a low-dropout regulator (LDO) but is not limited thereto.

In one example, the output signal $V_O$ is not fed back to the PWM modulator 410. That is, the switching amplifier 40 may be an open-loop configuration. The switching power stage 430 does not transmit the output signal $V_O$ back to the PWM modulator 410.

In one example, the output signal $V_O$ is fed back to the PWM modulator 410. That is, the switching amplifier 40 may be a closed-loop configuration with a feedback path from the switching power stage 430 to the PWM modulator 410. The switching power stage 430 transmits the output signal $V_O$ back to the PWM modulator 410. The PWM modulator 410 may generate the PWM signal according to the input signal $V_{IN}$, the output signal $V_O$, and the control signal $V_{ctrl}$.

In one example, the switching amplifier 40 may be applied to audio applications. That is, the load 440 may be a speaker, but is not limited thereto.

To sum up, the present invention provides a switching amplifier with adaptive supply-voltage scaling. The pulse widths of the PWM signal and the adaptive supply voltage of the switching power stage are adjusted accordingly to reduce the timing non-idealities effect on the output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switching amplifier, comprising:
   a controller, configured to receive an input signal and a reference signal, and to generate a control signal according to the input signal and the reference signal;
   a pulse-width modulation (PWM) modulator, coupled to the controller, configured to generate a PWM signal according to the input signal and the control signal;
   a power management unit, coupled to the controller, configured to receive a power supply and the control signal, and to provide an adaptive supply voltage according to the power supply and the control signal; and
   a switching power stage, coupled to the power management unit and the PWM modulator, configured to generate an output signal according to the PWM signal and the adaptive supply voltage;
   wherein the controller generates the control signal to adjust a plurality of pulse widths of the PWM signal and the adaptive supply voltage, and an adjustment of the plurality of pulse widths of the PWM signal and an adjustment of the adaptive supply voltage are complementary.

2. The switching amplifier of claim 1, wherein the controller detects a voltage or a current of the input signal.

3. The switching amplifier of claim 1, wherein the switching power stage comprises a plurality of power switches.

4. The switching amplifier of claim 1, wherein the switching power stage comprises a half-bridge topology or a full-bridge topology.

5. The switching amplifier of claim 1, wherein the reference signal comprises at least one value, and the adaptive supply voltage is changed according to the input signal and the at least one value of the reference signal.

6. The switching amplifier of claim 1, wherein the adaptive supply voltage and the plurality of pulse widths of the PWM signal are determined according to whether an absolute value of the input signal is smaller than the reference signal.

7. The switching amplifier of claim 6, wherein the adaptive supply voltage is halved and the plurality of pulse widths of the PWM signal are doubled, if the absolute value of the input signal is smaller than the reference signal.

8. The switching amplifier of claim 6, wherein the adaptive supply voltage and the plurality of pulse widths of the PWM signal are not changed, if the absolute value of the input signal is not smaller than the reference signal.

9. The switching amplifier of claim 1, wherein the input signal comprises a digital signal or an analog signal.

10. The switching amplifier of claim 1, wherein the power supply comprises a direct-current (DC) power supply.

11. The switching amplifier of claim 1, wherein the power supply comprises an alternating-current (AC) power supply.

12. The switching amplifier of claim 1, wherein the power management unit comprises a DC-DC buck converter, a DC-DC boost converter, a DC-DC buck-boost converter or a low-dropout regulator (LDO).

13. The switching amplifier of claim 1, wherein the output signal is not fed back to the PWM modulator.

14. The switching amplifier of claim 1, wherein the output signal is fed back to the PWM modulator.

* * * * *